United States Patent [19]

Ohtani et al.

[11] Patent Number: 4,658,494
[45] Date of Patent: Apr. 21, 1987

[54] APPARATUS FOR DRILLING PRINTED CIRCUIT BOARDS

[75] Inventors: Tamio Ohtani, Hadano; Yasuhiko Kanaya, Machida; Hiroshi Aoyama, Ebina; Nobuyasu Nonaka, Sagamihara, all of Japan

[73] Assignee: Hitachi Seiko Ltd., Tokyo, Japan

[21] Appl. No.: 867,553

[22] Filed: May 28, 1986

[30] Foreign Application Priority Data

May 28, 1985 [JP] Japan .................. 60-113096
Oct. 18, 1985 [JP] Japan .................. 60-231225
Dec. 25, 1985 [JP] Japan .................. 60-198382[U]

[51] Int. Cl.⁴ .................................... B23Q 3/157
[52] U.S. Cl. .................................. 29/568; 408/3; 408/6; 408/8; 408/16
[58] Field of Search .............. 29/568; 408/3, 6, 16, 408/8

[56] References Cited

U.S. PATENT DOCUMENTS 3,973,863  8/1976  Smith ........................ 408/241 R
4,000,954  1/1977  Patel ........................ 408/3
4,340,326  7/1982  Buonauro et al. ............. 408/16
4,596,067  6/1986  Raiteri ....................... 408/3 X

FOREIGN PATENT DOCUMENTS

64246  12/1984  Japan .
56841   4/1985  Japan .................. 29/568

Primary Examiner—Gil Weidenfeld
Assistant Examiner—Steven C. Bishop
Attorney, Agent, or Firm—Antonelli, Terry & Wands

[57] ABSTRACT

An apparatus for forming openings in printed circuit boards includes a work table for supporting the printed circuit boards, and at least one drilling unit movable relative to the work table. The apparatus uses drills each having a shank, a collar fitted around the shank at a predetermined position. For holding these drills, at least one first tool holding device is provided on the work table, and at least one second tool holding device of a magazine type for containing the drills parallel to each other is removably mounted above the work table. At least one transferring device is provided to operate to push a desired drill out of the second tool holding device of the magazine type, hold the pushed-out drill and transfer the same to a position where it is aligned with the drilling unit.

10 Claims, 21 Drawing Figures

APPARATUS FOR DRILLING PRINTED CIRCUIT BOARDS

BACKGROUND OF THE INVENTION

This invention relates to an apparatus for automatically forming openings of different sizes at desired locations in printed circuit boards by using a plurality of drills, and more particularly it is concerned with an improvement in or relating to a mechanism of the apparatus for attaching a drill to and detaching it from a drilling unit.

Generally, printed circuit boards require many openings of different diameters to be drilled at precise locations. To this end, it is usual practice to prepare, in volume production of printed circuit boards, a plurality of types of drills necessary for forming openings of required diameters and change the drills for the drilling of different sized openings. The use of drills of a plurality of sizes increases the overall size of the drilling apparatus because of the need of space for storing the drills, and exerts great influences on the operation efficiency of drilling because drill changing is a timeconsuming operation.

To aid in efficiently drilling printed circuit boards, a proposal has been made in U.S. Pat. No. 3,973,863 to use a device for automatically changing drills. This device uses drills each of which has a collar fitted around its shank at a predetermined location to ensure the tip of the drill having a precise length necessary for drilling the printed circuit boards. A plurality of tool holders each substantially cylindrical in configuration and formed with a plurality of axial slots are supported on a movable work table of the apparatus for retaining the drills. The drills of different sizes are each inserted in one of the tool holders by bringing the collar into frictional engagement with the holder, and held in position with the shank being oriented upwardly. To attach one of such drills to the drilling unit of the apparatus for forming openings in the printed circuit boards, the drilling unit and the drill holders are first moved relative to each other to align the desired drill with the spindle of the drilling unit. Then, a collet chuck at the lower end of the spindle is opened to allow the shank of the desired drill to be inserted in the collet chuck while the spindle moves downwardly. The downward movement of the spindle continues until the collet chuck abuts against the collar of the drill, and thereafter, the collet chuck is closed to grip the drill. By attaching the drill to the spindle of the drilling unit in this way, it is possible to ensure that the distance between the forward end of the spindle of the drilling unit and the tip of the drill is kept constant each time drill changing is effected. This allows drill changing to be effected while at the same time ensuring that the tip of the drill extends a precise distance to effect proper penetration of the printed circuit boards in a drilling operation.

Meanwhile, Japanese Patent Unexamined Publication No. 64246/1984 discloses a system for mounting a plurality of cutters to a machine tool by using detachable magazines. In this system, the plurality of cutters are each received in one of the through-holes formed in each magazine of a flat plate shape, and retained by frictional engagement in the through hole. Clamp means provided with a chuck mechanism that can be opened and closed is located adjacent the work table of the machine tool to insert a cutter in the magazine and withdraw same therefrom. When it is desired to effect cutter changing by using this system, the magazine is first moved to bring the desired cutter into alignment with the clamp means. Then, the clamp means is moved upwardly to grip the cutter by its chuck and withdraw same from the magazine. After the magazine is moved away, a working unit is moved to a position above the clamp means where the working unit is aligned with the cutter gripped by the clamp means. The clamp means is moved upwardly again so as to fit the cutter to the collet of the working unit. The process described hereinabove is reversed when it is desired to insert the cutter in the magazine after being used to perform drilling. Thus, this system facilitates preparing and handling the cutters and reduces space for holding cutters in a machine tool by using at least one detachable magazine for retaining the cutters.

In the drill changing device according to the U.S. Patent described above, however, a plurality of drills are arranged horizontally in rows on the work table. This arrangement offers a disadvantage in respect of requiring more space for retaining the drills. Also, in case that the chuck did not open sufficiently widely to grip the drill or the collet were out of alignment with the drill holder, frictional drag of the collet on the shank of the drill would increase in magnitude, giving rise to the danger that the collet might grip the drill without coming into contact with the collar around the shank. If this occurred, the tip of the drill would move downwardly a distance greater than the specified one and might penetrate the work table, resulting in a reduced service life of the drill or damage of the drill.

In the system according to Japanese Patent Unexamined Publication No. 64246/1984, it is required to provide each clamp means with a chuck opening and closing mechanism. Additionally, in order that the cutter may be positively transferred, the collet of the working unit and the chuck of the clamp means have to be opened and closed positively in synchronism with each other. This would give rise to the problem that the system becomes large in size and complex in construction.

SUMMARY OF THE INVENTION

The invention has an object to provide an improved apparatus for drilling printed circuit boards which facilitates the handling of drills and enables transfer of the drill to be effected positively with a simple construction.

Another object is to provide an apparatus for forming openings in printed circuit boards in which the collet of a drilling unit is able to grip a drill positively.

Still another object is to provide an apparatus for drilling printed circuit boards, wherein the tip of a drill is ensured to extend from the collet of a drilling unit a predetermined distance in spite of a drill changing having been effected and it is possible to prevent any defective drilling from being caused owing to abnormality in the tip of the drill.

A further object is to provide an apparatus for drilling printed circuit boards having at least one drill cassete which is high in productivity and capable of positively retaining drills with a simple construction.

According to the invention, there is provided an apparatus for drilling printed circuit boards comprising a printed circuit boards support table and at least one drilling unit which are movable relative to each other, wherein a plurality of drills each having a collar fitted around its shank in a predetermined position, are used, in addition to first tool holding means provided on the support table, second tool holding means of the magazine type is removably mounted above the table for containing a plurality of drills parallel to each other, and tool transferring means is provided for pushing a desired drill out of the second tool holding means, holding and conveying the same to a position in which the drill is aligned with the drilling unit.

In a preferred form of the apparatus according to the invention, the tool transferring means is movable toward the second tool holding means so that the drill held by the tool transferring means can be inserted in the second tool holding means again.

According to another aspect of the invention, the apparatus further comprises tool attaching means for moving a drill lengthwise thereof by applying pressurized gas to the collar of the drill. The drill selected according to the diameter of the hole to be formed is grasped by the collet of the drilling unit directly from the first tool holding means on the table or via the tool transferring means from the second tool holding means above the table. Then, the drill gripped by the collet is temporarily released therefrom onto the tool attaching means. The tool attaching means applies pressurized gas to the collar of the drill to move the same toward the collet until it abuts against the latter. The result of this is that the drill is positively gripped by the collet of the drilling unit with the collar of the former abutting against the latter.

According to still another aspect of the invention, there is provided the apparatus further comprising means for sensing the tip of the drill gripped by the collet of the drilling unit. The drill tip sensing means is connected to a control unit for controlling the operation of the apparatus. The control unit operates to interrupt the operation of the apparatus and give a warning when the sensing means detects that the tip of the drill is incorrectly positioned.

Other objects, features and advantages of the invention will become apparent from the description set forth hereinafter with reference to the accompanying drawings.

DESCRIPTION OF THE PREFERRED EMBODIMENT

Figure 1:
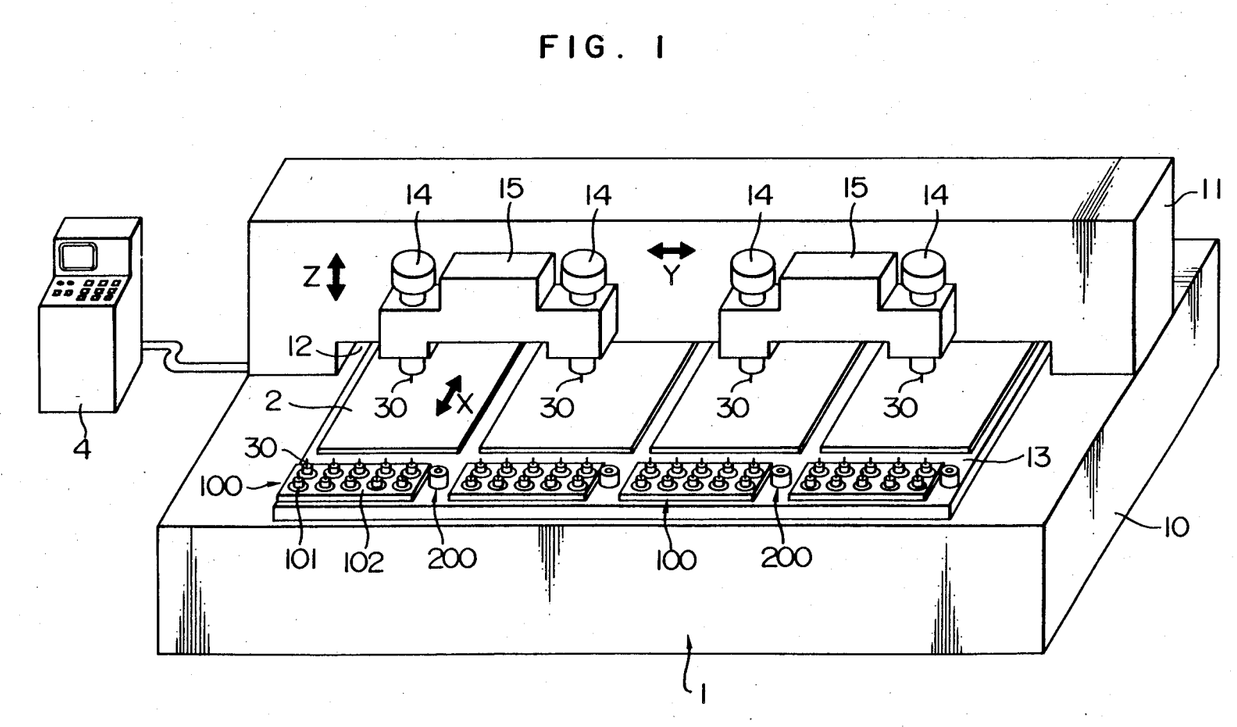
FIG. 1 is a perspective view showing the whole of an apparatus for drilling printed circuit boards according to an embodiment of the invention.
Figure 2:
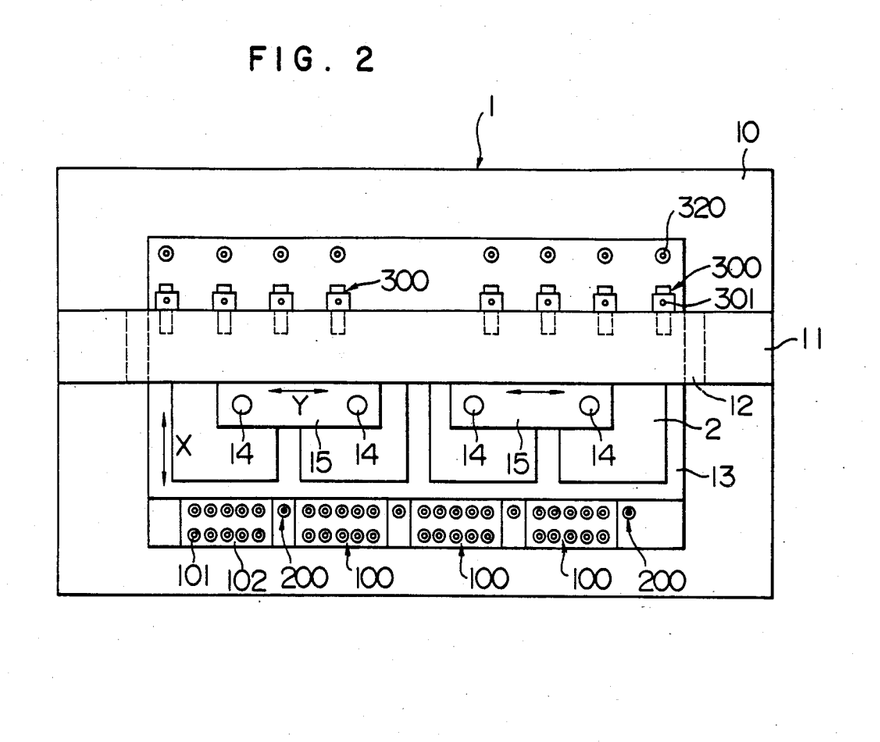
FIG. 2 is a top plan view of the apparatus shown in FIG. 1.

The whole structure of an apparatus according to a preferred embodiment of the invention will now be described by referring to FIGS. 1 and 2.

The apparatus generally designated by the reference numeral 1 comprises a bed 10 serving as a base member. Provided on the bed 10 is a column 11, which is laid across a top surface of the bed 10 to define an opening 12 therebetween. A movable work table 13 for supporting a plurality of printed circuit boards 2 is placed on the bed 10 to extend through the opening 12. The work table 13 is adapted to be moved by a driving device (not shown) in directions designated by arrows X in the drawings. Spindles 14 corresponding in number to the printed circuit boards 2 each located in a predetermined position on the work table 13 are arranged above the respective printed circuit boards 2. Each of the spindles 14 has at its lower end a collet for gripping a drill 30, and is fixedly supported by a housing 15. In each spindle 14, a mechanism for rotating the collet and a mechanism for opening and closing the same are incorporated. The housings 15 are movably supported by the column 11 and driven by a driving device (not shown) for movement in directions indicated by arrows Y and Z in the drawings. The reference numeral 4 shown in FIG. 1 designates a control unit for the drilling apparatus 1 which comprise a microprocessor. The control unit 4 can be set for working process steps according to the type of printed circuit boards to be worked on, and is connected to the various component parts of the drilling apparatus 1 so as to control their operations according to the process steps programed beforehand.

Moreover, first tool holding devices 100 and tool attaching devices 200 are provided on the work table 13 in predetermined positions adjacent the printed circuit boards 2. Each first tool holding device 100 comprises a plurality of tool holders 101 of substantially cylindrical configuration which are arranged in a plurality of rows and spaced apart from each other by a predetermined distance on a tool plate 102. The tool plate 102 is removably mounted on the work table 13. Further, as shown in FIG. 2, tool transferring devices 300 for second tool holding devices are provided on the opposite side of the column 11 from the first tool holding devices 100. Each tool transferring device 300 includes a first actuator 301 which is supported by the column 11 to locate above the work table 13, and a tool transferring element 320 arranged on the work table 13.

Figure 3:
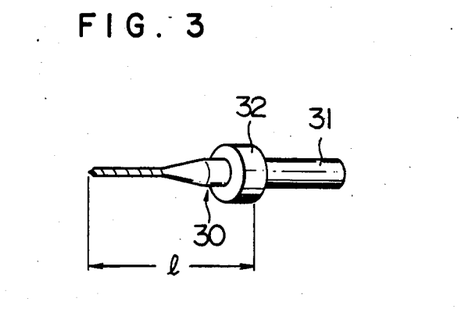
FIG. 3 is a view showing one example of drills which are used with the apparatus according to the invention.

FIG. 3 shows a drill 30 which is used with the drilling apparatus according to the invention 1. The drill has a shank 31, and a collar 32 formed as of a synthetic resinous material is attached to the shank 31. The collar 32 is press-fitted around the shank 31 to be positioned from the tip of the drill by a distance l which is beforehand determined.

Figure 4:
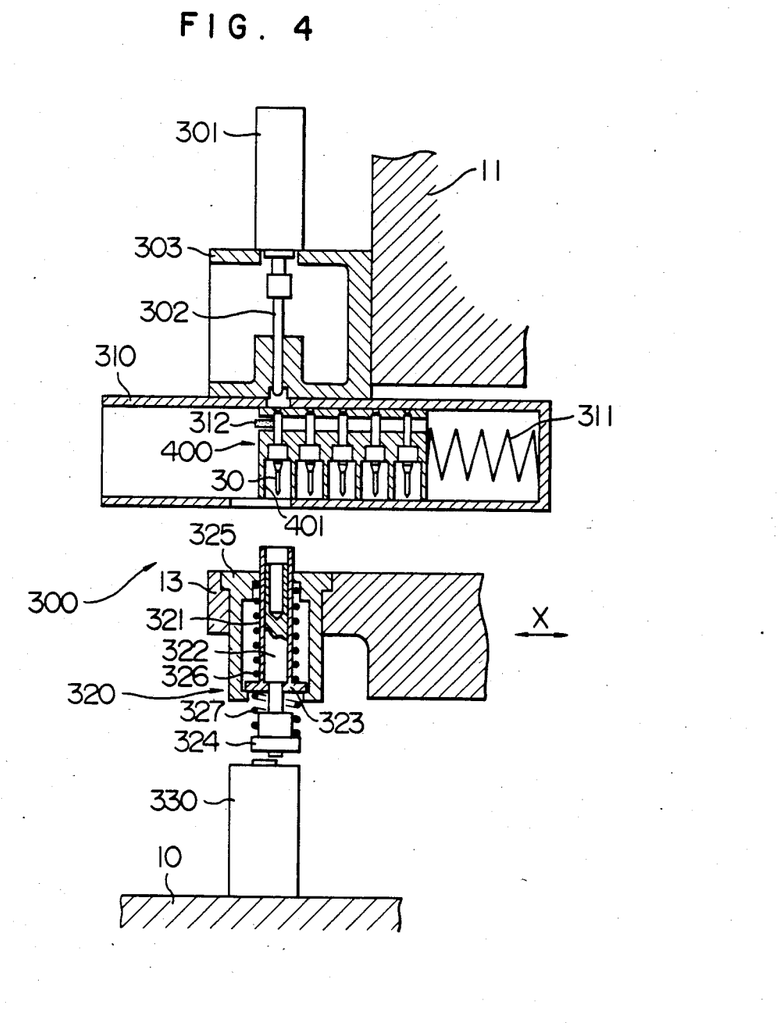
FIG. 4 is a sectional view showing a drill magazine and tool transferring means incorporated in the apparatus shown in FIG. 1.

Referring to FIG. 4, each of the tool transferring devices 300 has the first actuator 301, a magazine guide 310, the tool transferring element 320 and a second actuator 330. The first actuator 301 is provided for moving its push-rod 302 in reciprocatory movement under the control of the control unit 4, and is fixed to the column 11 through a bracket 303. The magazine guide 310 of an elongated box shape is attached to a bottom surface of the bracket 303 to extend in the direction of movement of the work table 13. The magazine guide 310 has an open end facing outwardly of the drilling apparatus 1, through which a drill magazine 400 is inserted into the magazine guide 310 to be supported thereby. The drill magazine 400 serves as a second tool holding device and is slidable in the drill magazine 400. A spring 311 is provided in the magazine guide at the closed end thereof, and urges the inserted drill magazine 400 toward the open end of the magazine guide 310. As subsequently to be described in detail, the drill magazine 400 is formed with a plurality of stepped through-holes 401 located parallel to each other each for receiving the drill 30. An opening for allowing the push-rod 302 of the first actuator 301 to extend therethrough is formed at a top wall of the magazine guide 310, and another opening greater in size than the former opening in the top wall is formed in a bottom wall of the magazine guide 310 at a position corresponding to that of the former opening. Further, the magazine guide 310 has a stopper 312 provided adjacent the opening in the top wall, which stopper can be manually operated. The stopper 312 is biased by a spring (not shown) to extend into the magazine guide 310, so that the stopper abuts against the drill 30 in the magazine located near the open end of the magazine guide 310 to keep the drill 30 in a position in which it is aligned with the push-rod 302 against the biasing force of the spring 311.

As described hereinabove, each tool transfer element 320 is mounted on the work table 13, and is arranged at a position where it can be aligned with one of the plurality of stepped through-holes 401 of the drill magazine 400 by the movement of the work table 13. The tool transferring element 320 includes an outer cylindrical member 321 and an inner cylindrical member 322 slidably fitted one in the other. The outer cylindrical member 321 has an outer diameter small enough to enable the same to be inserted in an increased diameter portion of each stepped through-hole 401 of the drill magazine 400, and an inner diameter large enough to accommodate the collar 32 of the drill 30. On the other hand, the inner cylindrical member 322 has an inner diameter large enough to loosely contain the tip of the drill 30. The outer cylindrical member 321 has at its lower end a bottom plate formed in the shape of a flange 323 which has a peripheral portion extending outwardly of the member 321 and has a through hole at its central portion. A lifter 324 is arranged below the bottom plate 323 coaxially with the outer and inner cylindrical members 321 and 322. The lifter 324 is coupled to the inner cylindrical member 32 by its reduced diameter portion which extends slidably through the hole in the bottom flange 323. Thus, the flange 323 of the outer cylindrical member serves as a stopper for the inner cylindrical member 322 in its downward movement, and the stroke of a downward movement of the inner cylindrical member 322 relative to the outer cylindrical member 321 is limited by the abutting of the inner cylindrical member 322 against the bottom flange 323 of the outer cylindrical member. On the other hand, the stroke of an upward relative movement of the inner cylindrical member 322 is limited by the abutting of the lifter 324 against the flange 323. The outer and inner cylindrical members 321 and 322 are disposed for sliding movement in a bracket 325 of substantially cylindrical configuration, and are mounted on the work table 13 through the bracket 325 which is fitted in the work table 13. A coil spring 326 is mounted in a compressed condition between an inner surface of an upper end of the bracket 325 and an upper surface of the bottom flange 323 of the outer cylindrical member 321 to bias the outer cylindrical member 321 downwardly with respect to the bracket 325. The stroke of a downward movement of the outer cylindrical member 321 is limited by the abutting of the bottom flange 323 thereof against a stopper portion formed at a lower end of the bracket 325. Moreover, another coil spring 327 of a greater biasing force than that of the coil spring 326 is mounted between the bottom flange 323 of the outer cylindrical member 321 and the lifter 324 to bias the inner cylindrical member 322 downwardly.

Figure 5A:
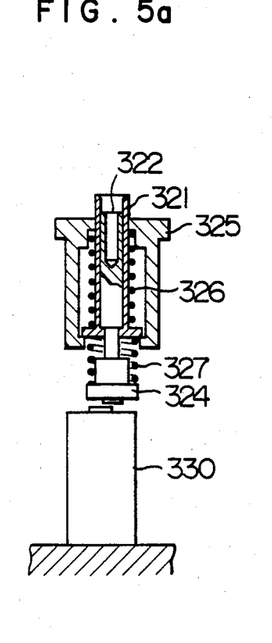
FIGS. 5a-5c are views for explaining the operation of the tool transferring element of the tool transferring means shown in FIG. 4.
Figure 5B:
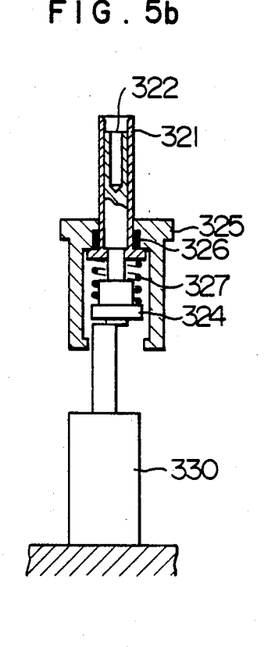
Figure 5C:
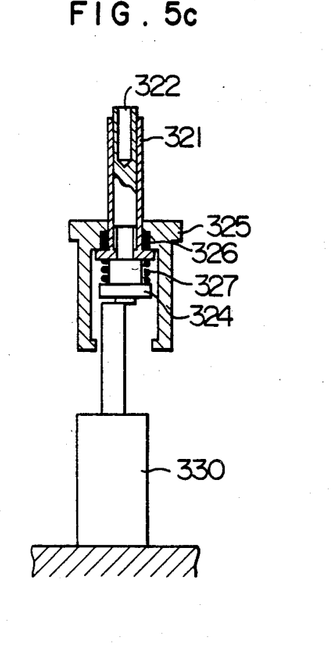

The second actuator 330 is an air cylinder using compressed air as power source, and secured to the bed 10 at a position corresponding to that of the first actuator 301. The second actuator 330 serves as a drive for moving the tool transferring element 320 in elevatory movement. Namely, as shown in FIG. 5a, when the second actuator 330 in an inoperative position, the outer cylindrical member 321 and the lifter 324 are in respective lower positions by the action of the springs 326 and 327. As the second actuator 330 is rendered operative and its piston begins to extend, the lifter 324 is lifted as shown in FIG. 5b. With the lifter 324 moving upwardly, the coil spring 326 of lower biasing force is first compressed through the coil spring 327 and the bottom flange 323 of the outer cylindrical member to allow the outer cylindrical member 321 to move upwardly. Further upward movement of the piston of the second actuator 330 compresses the coil spring 327, as shown in FIG. 5c, to move the lifter 324 and inner cylindrical member 322 upwardly. This causes an upper end portion of the inner cylindrical member 322 to stick out of an upper end of the outer cylindrical member 321.

Figure 6A:
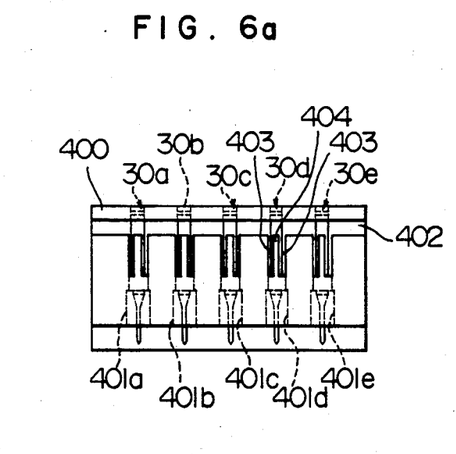
FIGS. 6a and 6b are a front view and a side view, respectively, of one constructional form of the drill magazine used with the tool transferring means shown in FIG. 4.
Figure 6B:
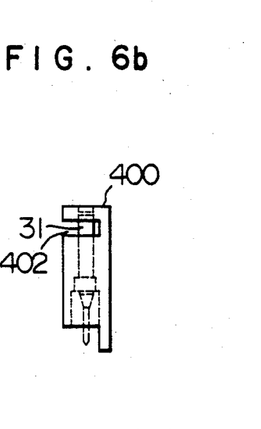

FIGS. 6a and 6b show the drill magazine 400 in detail. The drill magazine 400 is a cassette-type container for drills, and is formed with the plurality of stepped through-holes 401a–401e arranged parallel to each other each of which has the increased diameter portion for accommodating the collar 32 of the drill 30. Also, a groove 402 is formed in the cassette-type drill container to extend lengthwise thereof across the through-holes for receiving the stopper 312 of the magazine guide 310. The stepped through holes 401a–401e are each formed with a pair of slits 403 which extend vertically downwardly from the groove 402 along each hole 401. These slits 403 define therebetween an arm portion 404 tilting inwardly to extend into the hole 401. The drill magazine 400 may be formed as of synthetic resinous material, and the arm portions 404 are preferably formed integrally with the drill magazine 404 when the latter is produced.

Figure 7A:
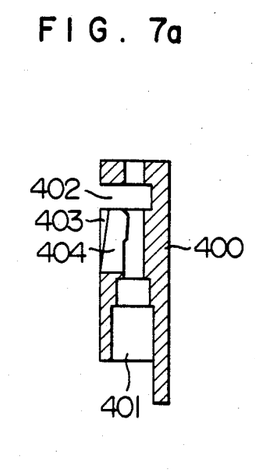
FIGS. 7a and 7b are sectional side views, on an enlarged scale, of the drill magazine shown in FIG. 6a, showing the same under conditions of containing no drill therein and of containing the drills therein, respectively.
Figure 7B:
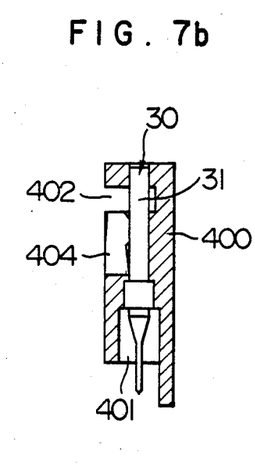

FIGS. 7a and 7b show the drill magazine 400 in the conditions of having the drills 30 contained therein and having no drills contained therein, respectively. When no drill is contained in the through-hole 401, the arm portion 404 extends partly into the through-hole 401 as shown in FIG. 7a. In case that the drill 30 is inserted in the through-hole 401 through its lower end in the condition shown in FIG. 7a, the shank 31 of the drill 30 pushes the arm portion 404 out of the through-hole 401 so that the arm portion undergoes elastic deformation. The result of this is that the resilience of the arm portion 404 acts on the shank 31 of the drill 30. The drill 30 is held in the through-hole 401 of the drill magazine 400 by the resilience of the arm portion 404.

Of all the openings formed in printed circuit boards, openings for allowing leads of electronic components to extend therethrough and those for connecting together conductors on top and bottom surfaces of a printed circuit board are large in number. This makes it necessary to provide a large number of drills of the same diameter for drilling these openings. The drill magazine of the construction described hereinabove admirably serves for this purpose. However, the drill magazine of the invention is not limited solely to this constructional form, and the drill magazine may be constructed to contain a plurality of drills of different diameters. In the embodiment of the invention shown and described hereinabove, each spindle 14 is provided with two drill magazines 400. The invention is not limited to this specific number of drill magazines, and the number of the drill magazines may be greater or smaller than two depending on the number and type of openings to be formed.

Figure 8:
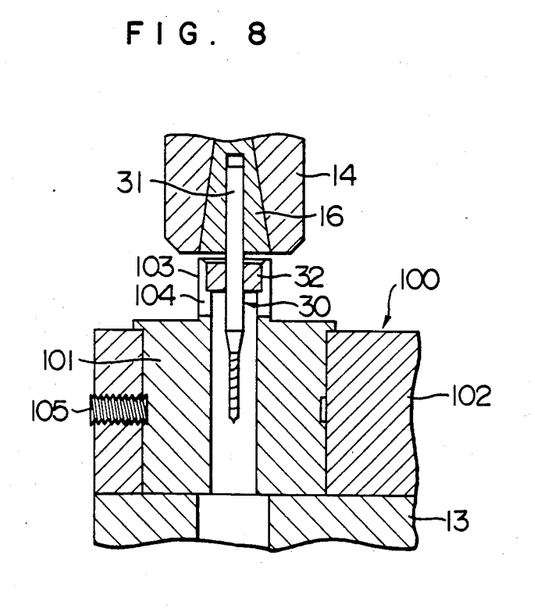
FIG. 8 is a sectional view of the tool holder assembled with the apparatus shown in FIG. 1.

FIG. 8 shows the tool holder 101 of each first tool holding device 100 in detail. As shown, the tool holder 101 is a cylindrical block which has a cylindrical projection 103 formed integrally and extending upwardly from its top surface. The cylindrical projection 103 of the tool holder 101 has an inner diameter slightly smaller than the outer diameter of the collar 32 of the drill 30 to be held thereby. The cylindrical projection 103 is formed with a plurality of axial slits 104. Thus, the tool holder 101 is so constructed as to receive the collar 32 of the drill 30 in the cylindrical projection 103 and grip the drill 30 by its resilience to hold the same in place. Each tool holder 101 is secured to the tool plate 102 through a screw as indicated at 105.

Figure 9:
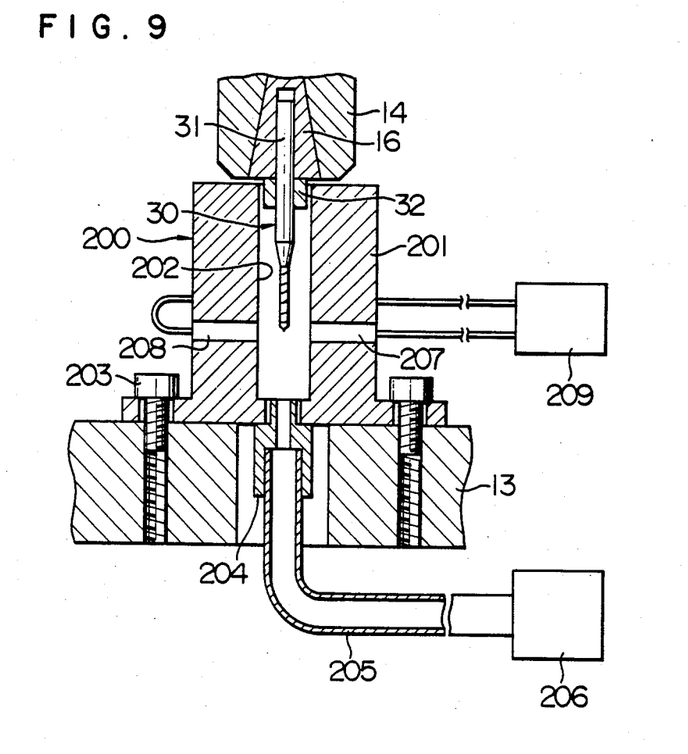
FIG. 9 is a sectional view showing tool attaching means which is incorporated in the apparatus shown in FIG. 1.

FIG. 9 shows the tool attaching device 200. As shown, the tool attaching device 200 comprises a main body 201 of substantially cylindrical configuration, which is bolted to the work table 13 as indicated at 203. The main body 201 is formed in a central portion thereof with an axial bore 202 of a diameter large enough to loosely receive the collar 32 of the drill 30. The axial bore 202 is connected at a lower end thereof to a source of compressed air 206 through a joint 204 and a hose 205. The source of compressed air 206 operates as instructed by the control unit 4 and supplies compressed air to the bore 202 of the main body 201. A light emitting element 207 and a light receiving element 208 are provided in the main body 201 at a predetermined axial height, and disposed at positions where they face each other across the bore 202. The elements 207 and 208 are connected to a sensing circuit 209 which detects the tip of the drill 30 based on outputs from the light receiving element 208 to ascertain the position of the tip of the drill 30.

Operation of the apparatus having the foregoing construction will be described hereinunder. In preparation for starting a drilling operation of the apparatus 1, the printed circuit boards 2 to be drilled are placed in predetermined positions on the work table 13. A plurality of drills of diameters matching those of the openings to be formed are mounted at predetermined positions on the drilling apparatus 1 by using the first tool holding devices 100 and drill magazines 400. The process steps to be followed in drilling the desired openings in the printed circuit boards are programmed beforehand and inputted in the control unit 4. After the aforesaid preparation is finished, the drilling apparatus 1 starts a drilling operation under the control of the control unit 4.

According to the program beforehand inputted, drills necessary for drilling first openings are taken out as instructed by the control unit 4. In the case that the desired drills 30 are held by the first tool holding devices 100, each housings 15 and the work table 13 are driven by the drives to move relative to each other to effect positioning of each spindle 14 with respect to the desired drill 30. After the spindle 14 is aligned with the desired drill 30, the collet 16 in the lower end of the spindle 14 is opened by the collet opening and closing mechanism. Subsequently, the spindle 14 is moved downwardly so that the collet 16 is loosely fitted over the shank 31 of the desired drill 30. Then, the collet 16 is closed to grip the drill 30 as shown in FIG. 8. At this time, however, the end face of the collet 16 does not contact the collar 32 of the drill 30 yet. Thereafter, the spindle 14 is moved upwardly to withdraw the desired drill 30 from the tool holder 101.

Figure 10A:
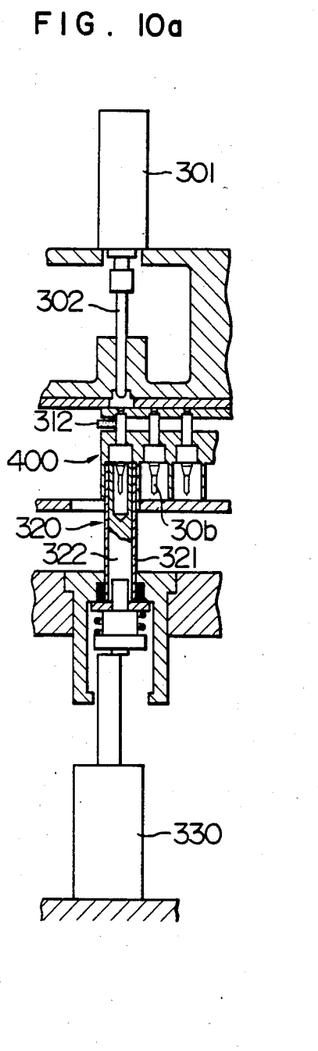
FIGS. 10a-10c are views for explaining the operation of the tool transferring means shown in FIG. 4.
Figure 10B:
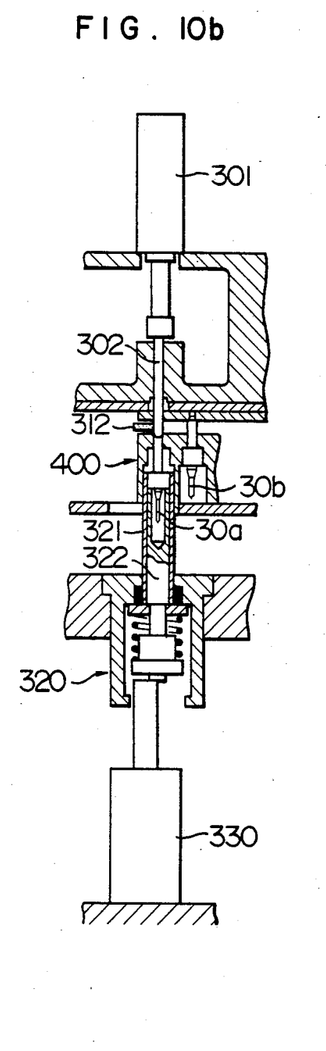
Figure 10C:
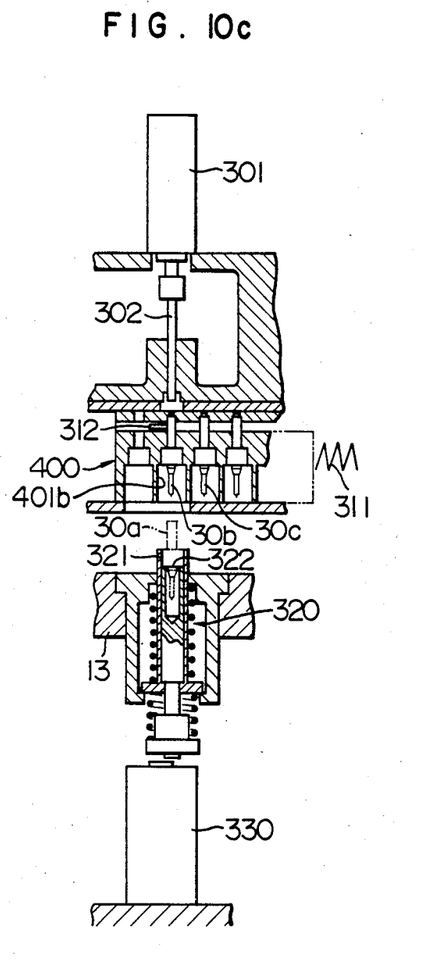

On the other hand, when the desired drills are contained in the drill magazines 400, the work table 13 is first moved to effect positioning of the stepped through-opening 401 containing the desired drill in each drill magazine 400 with the associated tool transferring element 320. Then, the second actuator 330 is rendered operative, so that the outer cylindrical member 321 of the tool transferring element 320 is inserted in the stepped through-hole 401a containing the desired drill 30a to support the same, as shown in FIG. 10a. Thereafter, the piston of the second actuator 330 is withdrawn into the cylinder while the first actuator 301 is operated to move the push-rod 302 outwardly. As a result, the push-rod 302 pushes the desired drill 30a downwardly out of the stepped through-hole of the drill magazine 400, and the outer and inner cylindrical members 321 and 322 of the tool transferring element 320 retains the collar 32 of the desired drill 30a, as shown in FIG. 10b. After the tool transferring element 320 has moved to its downmost position, the work table 13 and each housing 15 are moved relative to each other so that each tool transferring element 320 is aligned with one of the spindles 14. Thereafter, as is in the case of the aforesaid operation with the first tool holding devices, the collet 16 of each spindle 14 is opened and closed to grip the shank 31 of the desired drill 30a. Finally, the work table 13 is moved to return the tool transferring element 320 to the position shown in FIG. 10c. As the push-rod 302 moves upwardly by the action of the first actuator 301, the push-rod 302 is released from abutting engagement with the stopper 312. Accordingly, the drill magazine 400 is moved by the biasing force of the spring 311 leftwardly in FIG. 10c until the stepped through-hole 401b containing the drill 30b adjacent the stepped through-hole 401a from which the desired drill 30a has just been pushed out is brought to the position where the next push-out operation is performed. In this way, the preparation for the next cycle of the drill withdrawing operation is effected.

The spindles 14 each gripping the drill 30 are positioned above the respective tool attaching devices 200 through the movement of the respective housings 15 and the work table 13. Then, each spindle 14 is moved downwardly to insert the drill with the collar 32 into the bore 202 of the each tool attaching device 200. Subsequently, compressed air is supplied to the bore 202 as instructed by the control unit 4 while the collet 16 is opened. As a result, the drill 30 is moved upwardly by the action of the compressed air applied to the collar 32 from below, so that the collar 32 is brought into abutting engagement with the lower end face of the collet 16. Following lapse of a predetermined period of time after the collet 16 is opened, the collet 16 is closed as instructed by the control unit 4 to grip the drill 30 as shown in FIG. 9. Thus, by the engagement of the collar 32 with the lower end face of the collet 16, it is possible to accurately position the tip of the drill 30 and ensure that the drill 30 is positively gripped by the collet at the shank 31.

Figure 11A:
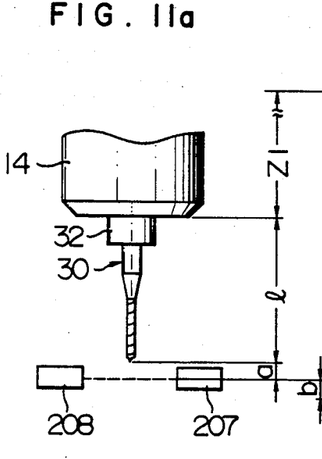
Figs. 11a and 11b are views in explanation of the manner how the tip of a drill is detected its position by using the sensing circuit associated with the tool attaching means shown in FIG. 9.

Then, the tip of the drill 30 gripped by the collet 16 is detected its position by the sensing circuit 209 associated with each tool attaching device 200. The spindle 14 gripping the drill 30 is first moved downwardly, as shown in FIG. 11a, from the upper end of its stroke by a distance Z1. The distance Z1 has been set such that, if the tip of the drill 30 is accurately positioned, the tip is located at a position higher than the path of light from the light emitting element 207 to the light receiving element 208 by a distance a. Thus, when the drill 30 is gripped normally, the light emitted by the light emitting element 207 is sensed by the light receiving element 208. On the other hand, in the event of abnormality in gripping the drill 30 by the collet such that the collar 32 of the drill 30 is out of engagement with the collet 16 of the spindle 14, or that the position at which the collar 32 is fitted around the shank 31 of the drill 30 is displaced upwardly, the tip of the drill 30 would stand in the path of light between the light emitting element 207 and light receiving element 208, thereby preventing the light from being incident on the light receiving element 208.

Figure 11B:
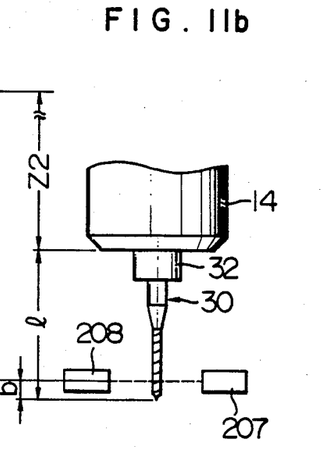

Thereafter, the drill spindle 14 is moved downwardly to a position lowered from the upper end of its stroke by a distance Z2 as shown in FIG. 11b. The distance Z2 has been set at a value such that, if the tip of the drill 30 is accurately positioned, the tip is located at a position lower than the path of travel of light from the light emitting element 207 to the light receiving element 208 by a distance b to prevent the light from being incident on the light receiving element 208. In the event of abnormality in the tip of the drill such that the tip is broken or that the collar 32 is not fitted around the shank 31 at the predetermined position, the light emitted by the light emitting element 207 would not be prevented from being incident on the light receiving element 208. Therefore, the light would be incident on the light receiving element 208, indicating the abnormality in the tip of the drill 30.

Thus, it is possible to detect abnormality in either gripping of the drill 30 or the tip of the drill itself by the sensing circuit 209 based on the outputs from the light receiving element 208. The sensing circuit 209 is connected to the control unit 4 so that the latter may interrupt the operation of the apparatus 1 and give an warning when any abnormality is detected by the sensing circuit 209.

When no abnormality is detected in the position of the tips of the drills 30 gripped by the spindles 14 by the sensing circuits 209, the drill spindles 14 are moved to predetermined positions above the printed circuit boards 2 as the housings 15 and the work table 13 are moved, to thereby effect drilling of openings.

Upon completion of forming the openings at predetermined positions in the printed circuit boards 2, the drills 30 which have been used are restored from the spindles 14 to the respective tool holders 101 in the reversed manner of the aforesaid drill attaching process, when the used drills 30 were originally stored in the first tool holding devices 100.

Figure 12A:
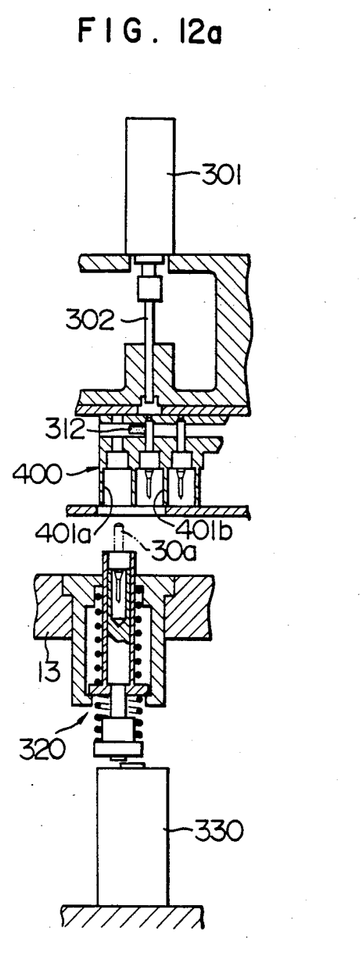
FIGS. 12a-12c are views for explaining the operation of the tool transferring means shown in FIG. 4.
Figure 12B:
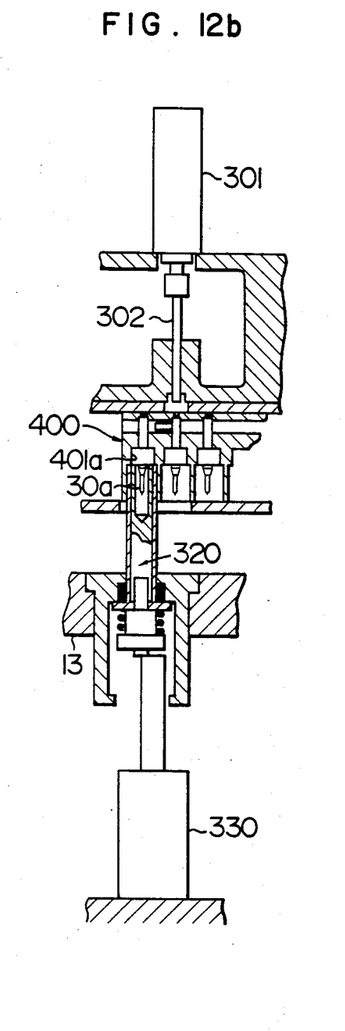
Figure 12C:
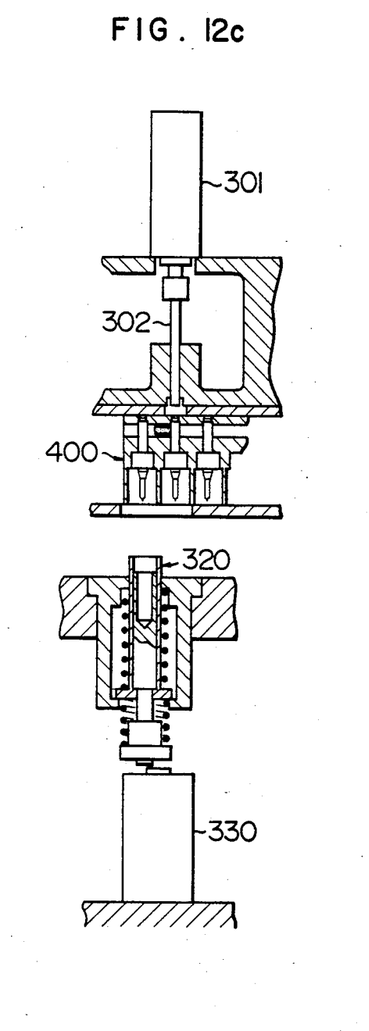

When it is desired to return the drills 30 into the drill magazines 400 after use, each used drill 30a is transferred from the associated spindle 14 to the tool transferring element 320 by reversing the process described hereinabove. Then, the work table 13 is moved to bring the drill 30a to a position in which it is aligned with the stepped through-hole 401b of the drill magazine 400 (see FIG. 10c). The work table 13 is further moved leftwardly in FIG. 10c a distance corresponding to the distance between adjucent stepped through-holes 401, so that the tool transferring element 320 is aligned with the stepped through-hole 401a of the drill magazine 400 as shown in FIG. 12a. Then, the second actuator 330 is rendered operative to move the tool transferring element 320 upwardly and insert it into the stepped through-hole 401a. At the same time, the drill 30 held by the tool transferring element 320 is also inserted into the stepped through-hole 410a and held therein by the engagement thereof with the arm portion 404. The second actuator 330 is operated again to allow the tool transferring element 320 to move downwardly to its lowermost position, as shown in FIG. 12c, thereby finishing one cycle of the drill changing operation.

From the foregoing description, it will be appreciated that the apparatus for drilling printed circuit boards according to the invention enables drills to be withdrawn, fed and stored with the mechanisms of simple construction, and that the use of the tool holding device of the magazine type facilitates handling of the drills without damaging the same.

Moreover, the apparatus enables the collet of each drill spindle to positively grip the drill and allows the tip of the drill to be accurately positioned by virtue of the use of the tool attaching device, thereby permitting openings to be drilled with a high degree of precision.

The construction of the drill magazine as used with the apparatus according to the invention enables the drill magazine to be formed of synthetic resinous material as a unitary structure. This is conductive to improved productivity of the drill magazines and a reduction in production costs thereof.

While one preferred embodiment of the invention has been shown and described hereinabove, it is to be understood that the invention is not limited to the specific form of the embodiment and that many changes and modifications may be made therein without departing from the scope of the appended claims. For example, although the embodiment includes the tool holding device of the magazine type, tool attaching device and drill tip sensing device in combination, it is not essential that the drilling apparatus be provided with all of them and one or some of these component parts may be provided to the drilling apparatus according to the degree of precision with which openings are required to be drilled.

What is claimed is:

1. An apparatus for automatically forming openings of predetermined sizes and locations in printed circuit boards, having: a movable work table for supporting printed circuit boards to be worked; at least one drilling unit provided with means for opening and closing a collet thereof, said drilling unit being movable relative to said work table; means for driving said work table and said drilling unit to move relative to each other; tool holding means mounted on said work table to hold a plurality of drills each having a collar fitted around a shank of said drill at a predetermined position; and a control unit for controlling operations of said drilling unit and said driving means in a predetermined manner that the drilling unit is brought into alignment with a desired drill held by said drill holding means, the collet of said drilling unit grips the shank of said desired drill with the former abutting against the collar of the latter, and said drilling unit is then moved to a predetermined position above the printed circuit boards to perform drilling, wherein the improvement comprises:

another tool holding means of a magazine type removably mounted above said work table for holding a plurality of the drills arranged parallel to each other; and tool transferring means operative under the control of said control unit to push a desired drill out of said magazine type tool holding means, hold the pushed-out desired drill and convey the same to a position where said pushed-out desired drill is in alignment with said drilling unit.

2. An apparatus as claimed in claim 1, wherein said tool transferring means is movable toward and away from the magazine type tool holding means so as to be able to insert the drill held by said tool transferring means into the magazine type tool holding means.

3. An apparatus as claimed in claim 2, wherein said magazine type tool holding means includes at least one cassette, said cassette being formed with a plurality of stepped through-holes each having an increased diameter portion for accommodating the collar of each said drill, and wherein said tool transferring means includes a guide for holding said cassette, a first actuator having a rod for pushing each said drill out of one of said stepped through-holes in the cassette; a tool transferring element of a double cylinder structure including an outer cylindrical member insertable into the increased diameter portion of each said stepped through-hole and an inner cylindrical member cooperating with said outer cylindrical member to support each said drill at its collar, and a second actuator for driving said outer and inner cylindrical members of the tool transferring element so that said members are inserted into each said stepped through-hole and retain the pushed-out drill at its collar or release the drill retained at its collar, said tool transferring element being mounted on said movable work table so as to be movable between a position where said tool transferring element is aligned with a predetermined one of said stepped through-holes in the cassette and a position where said element delivers the drill to the drilling unit or receives a drill therefrom.

4. An apparatus as claimed in claim 3, wherein said cassette is mounted on said guide for movement therealong, and said guide is provided with a spring for urging the cassette by its biasing force in a direction in which the drills are arranged parallel to each other in the cassette, and a stopper located in a position where said stopper contacts with the drill in the cassette remote from the spring against the biasing force thereof so as to aligne the stepped through-hole containing said drill with the rod of said first actuator, whereby the cassette is moved, each time one of the drills held therein is pushed out of the associated stepped through-hole, by the biasing force of said spring to a position where one stepped through-hole adjacent the stepped through-hole from which the drill has just been pushed out is aligned with the rod of the first actuator.

5. An apparatus as claimed in claim 1, wherein said magazine type tool holding means comprises at least one cassette, and said cassette is formed with a plurality of stepped through-holes each for slidably receiving the shank and the collar of a drill, and a plurality of arm portions engaging respective shanks of the drills inserted in the associated stepped through-holes to hold the same, each said arm portion being defined by a pair of slits formed and extending along each said through-hole at a wall portion thereof and partially projecting into the through-hole to resiliently engage the shank of each drill.

6. An apparatus for automatically forming openings of predetermined sizes and locations in printed circuit boards comprising:

a movable work table for supporting printed circuit boards to have openings drilled;

at least one drilling unit provided with means for opening and closing a collet thereof, said drilling unit being movable relative to said work table;

driving means for moving said work table and said drilling unit relative to each other;

first tool holding means mounted on said work table to hold a plurality of drills each having a collar fitted around its shank at a predetermined position;

second tool holding means of a magazine type removably mounted above said work table for holding a plurality of the drills arranged parallel to each other;

tool transferring means operative to push a desired drill out of said second tool holding means, hold the desired drill that has been pushed out of the second tool holding means and convey the same to a position where said pushed-out desired drill is in alignment with said drilling unit;

tool attaching means located on said work table for applying pressurized gas to the collar of the drill to move the same axially thereof; and a control unit operative to control operations of the component parts of the apparatus in a predetermined order that a desired drill is selected according to a diameter of an opening to be drilled, the drilling unit is brought into alignment with the selected drill either directly when the same is held in the first tool holding means or through the tool transferring means when the selected drill is held in the second tool holding means, after the selected drill is gripped by the collet of the drilling unit, the drilling unit is moved to a position in which the selected drill held thereby is aligned with the tool attaching means, the selected drill is temporarily released from gripping engagement with the collet and applied with pressurized gas to its collar by the tool attaching means, the selected drill is gripped by the collet again with the collar of the drill contacting the collet, and the drilling unit with the selected drill is moved to a predetermined position above the printed circuit boards to effect drilling of an opening.

7. An apparatus as claimed in claim 6, wherein said tool attaching means comprises a bore for loosely receiving the collar fitted around the shank of the drill, and a source of pressurized gas connected with said bore to selectively feed pressurized gas thereinto.

8. An apparatus as claimed in claim 6, further comprising sensing means for detecting the position of a tip of the drill gripped by the collet to ascertain that the tip of the drill accurately extending from the collet by a predetermined length and/or that the tip of the drill gripped by the collet is free from damage, said drill tip sensing means being associated with the tool attaching means.

9. An apparatus as claimed in claim 8, wherein said sensing means is connected to said control unit, and said control unit being constructed so that when the drill tip sensing means detects abnormality in the position of the tip of the drill, the control unit renders the drilling apparatus inoperative and causes alarm to be issued.

10. An apparatus for automatically forming openings of predetermined sizes at predetermined positions in printed circuit boards, comprising:

a stationary base member;

a work table movably mounted on said stationary base member for supporting printed circuit boards in which openings are to be drilled;

at least one drilling unit including a collet for gripping a drill, and drive means for opening and closing said collet;

a housing mounted on said base member for supporting said drilling unit for movement relative to said work table;

drive means for moving said work table and said drilling unit relative to each other;

first tool holding means mounted on said work table for holding a plurality of drills each having a collar fitted around its shank at a predetermined position, each said drill being arranged with its tip directed downwardly;

second tool holding means of a magazine type removably mounted on said housing above said work table for holding a plurality of the drills arranged parallel to each other, said second tool holding member including a cassette provided with a plurality of stepped through-holes into each of which the shank and collar of each drill are slidably fitted;

tool transferring means for taking a desired drill out of the associated stepped through-hole of said second tool holding means and holding the desired drill so as to transfer the same between the second tool holding means and the drilling unit;

tool attaching means provided on said work table, said tool attaching means including a bore for loosely receiving the collar of the drill, and a source of pressurized gas connected with said bore for selectively supplying pressurized gas to said bore;

a control unit for controlling operations of the component parts of the apparatus in a predetermined manner that a desired drill is selected according to a diameter of an opening to be drilled, the drilling unit is brought into alignment with the selected drill either directly when the same is held in the first tool holding means or through the tool transferring means when the selected drill is held in the second tool holding means, after the selected drill is gripped by the collet of the drilling unit, the drilling unit is moved to a position in which the selected drill is aligned with the bore of the tool attaching means, at this position the selected drill is temporarily released from gripping engagement with the collet of the drilling unit and applied with pressurized gas to its collar by the tool attaching means to move lengthwise thereof toward the collet, the selected drill is gripped by the collet again with the collar of the drill contacting the collet, and the drilling unit with the selected drill is moved to a predetermined position above the printed circuit boards to effect drilling of an opening; and sensing means for detecting the position of the tip of the drill gripped by the collet to ascertain that the tip of the drill is accurately extending from the collet by a predetermined length and/or that the tip of the drill gripped by the collet is free from damage, said drill tip sensing means being associated with the tool attaching means and connected to the control unit so that, when the sensing means detects abnormality in the position of the tip of the drill, an warning is given and the apparatus is rendered inoperative.

* * * * *